United States Patent [19]

Lin

[11] Patent Number: 5,084,152

[45] Date of Patent: Jan. 28, 1992

[54] METHOD FOR PREPARING HIGH DENSITY MAGNETIC RECORDING MEDIUM

[75] Inventor: Jiang-Ching Lin, Yun Lin Hsien, Taiwan

[73] Assignee: Industrial Technology Research Institute, Hsinchu, Taiwan

[21] Appl. No.: 591,730

[22] Filed: Oct. 2, 1990

[51] Int. Cl.⁵ .............................................. C23C 14/34
[52] U.S. Cl. .............................. 204/192.15; 204/192.2; 204/192.3
[58] Field of Search ............ 204/192.15, 192.2, 192.16, 204/192.3

[56] References Cited

U.S. PATENT DOCUMENTS

| | | | |
|---|---|---|---|
| 4,552,820 | 11/1985 | Lin et al. | 204/192.15 X |
| 4,824,724 | 4/1989 | Ueda et al. | 204/192.2 X |
| 4,865,878 | 9/1989 | Nagas et al. | 204/192.2 X |
| 4,900,397 | 2/1990 | Werner et al. | 204/192.2 X |

*Primary Examiner*—Nam X. Nguyen
*Attorney, Agent, or Firm*—Scully, Scott, Murphy & Presser

[57] ABSTRACT

RF sputtered CoCrTa film deposited on a thin Cr underlayer for longitudinal magnetic recording and the preparation method thereof are disclosed. The film exhibits a (1010) texture which provides a high coercivity of 1190 Oe. The high coercivity is obtained on a 200 Å Cr underlayer with a low argon pressure of 4 mtorr and high substrate bias of −100 V.

8 Claims, 3 Drawing Sheets

METHOD FOR PREPARING HIGH DENSITY MAGNETIC RECORDING MEDIUM

BACKGROUND OF THE INVENTION

The present invention relates to a magnetic medium (CoCrTa) comprising a nonmagnetic substrate such as glass or an Al-Mg alloy, a thin Cr underlayer RF sputtered on the substrate, and a CoCrTa magnetic layer RF sputtered on the Cr underlayer, and the preparation method of the magnetic medium.

It is very common that magnetic recording media such as disks, as well as magnetic tapes are used in recording and storing computer data, video and audio signals, etc. The higher the recording density of the magnetic materials, the lesser the area required for recording. In other words, these media will fulfill the increasing trends of light weight, thinness, and small size required for electronic products applications. However, high coercivity (Hc) is needed in order to obtain high recording density for the magnetic medium. Therefore, much effort has been put into research in order to obtain thin magnetic recording media of excellent recording density.

Owing to the fact that the residual magnetization and coercivity of thin films are higher than that of oxide powders, the conventional hard disks coated with oxide powders have been changed to thin film disk. An appropriate magnetic material is sputtered onto a nonmagnetic metallic underlayer to form a thin metallic medium of layered structure to increase the Hc and consequently recording density of the magnetic medium.

FIG. 1. illustrates the layered structure of a sputtered thin film hard disk. Aluminium substrate (1) is first electrolessly plated with nickel phosphate (2) and then placed into a sputtering compartment. The Cr underlayer (3) Co based alloy magnetic film (4) and carbon protective layer (5) are sequentially sputtered with thicknesses of 2500 A, 600 A and 300 A. When the sputtering procedure is completed, the disk is subjected to a lubricating treatment (6) and a testing procedure.

Cr underlayer is used to improve the coercivity of the magnetic medium by epitaxial growth of the magnetic grains on the well textured Cr grains. And, the recording density of the medium is thus increased.

Magnetic layer materials such as CoNiCr (Co-30% Ni-7.5% Cr or Co-20% Ni-10% Cr) or CoCrTa alloys, etc., are substantially used for data storage. The carbon film is used to protect the metallic layers underneath from the corrosive environment and to prevent them from being worn by the movement of the magnetic head.

In order to increase the coercivity of the recording medium so as to increase the recording density, not only should the recording properties of the magnetic medium be improved, but the Cr underlayer should also be studied. This is due to the fact that the Cr underlayer influences the coercivity of the medium dramatically. In particular, the thickness of the Cr underlayer has a great influence on the coercivity of the medium. Research has demonstrated that the coercivity of the medium increases as the thickness of Cr underlayer increases. When the thickness of the Cr underlayer is 2500 A, the coercivity thereof is approaching the saturation value. However, to sputter Cr underlayer to such a thickness, much time and materials are needed. Thus, the cost of production is high and unfavorable for mass production. Furthermore, crystal defects are likely to be formed if the thickness of the Cr film is over 2500 A. The defect may be one of the factors which causes noise in recording and reproducing.

Prior art shows that for CoNiCr medium to possess a coercivity of greater than 1000 Oe, the thickness of the Cr underlayer should be greater than 2000 A. For the CoCrTa/Cr medium, to obtain a coercivity greater than 1100 Oe, the thickness of the Cr underlayer should also be greater than 2500 A.

IEEE Transacions on Magnetics, Mag-22, No. 5, Sept. 1986, pp573-575 disclosed an alloy sputtered disk (developed by the Institute for Super Materials, ULVAC Corp.) The alloys sputtered are Co-30Ni-7.5Cr and Co-20Ni-10Cr film series. The underlayer of the disk is Cr. If the thickness of the underlayer is 200 A, the coercivity of the media is only 500 Oe. Only when the thickness of the Cr underlayer is larger than 2000 A, will the coercivity be 1000 Oe.

In IEEE Transaction on Magnetics, MAG-22, No. 5, p334, 1986, G. L. Chen disclosed a CoNiCr/Cr medium deposited by DC Magnetron Sputtering. It is found that epitaxial crystal growth is formed. This is due to the fact that the atomic stacking density of Co HCP(10T1) and that of Cr bcc(110) are approximately equal.

The epitaxial growth makes the C axis parallel to surface of the CoNiCr film, thus enhancing Hc. However, a magnetic layer with coercivity of 1000 Oe needs a Cr underlayer at least 2500 A thickness.

R. D Fisher, in IEEE Transaction on Magnetics, MAG-23, No. 5, p352, September, 1986 disclosed the new Co-14Cr-2Ta film for longitudinal recording medium. Under its sputtering conditions, the Cr underlayer is 2500 A, the coercivity is approaching the saturation value of 1100 Oe.

J. Appl. Phys. 63(8), p3260, April 1988 disclosed a CoCrM/Cr medium, wherein M is a third element and if the thickness of the Cr underlayer is over 2500 A, the coercivity of the medium is approaching saturation. As a result of this, the S/N ratio is approximately 4 dB higher than that of the conventional disk.

Japanese Patent JP 1133217, published in May, 1989, issued to Victor Co. disclosed a CoCrTa/Cr medium for longitudinal recording. The medium is obtained by DC Magnetron sputtering under an argon pressure of 5 mtorr. The composition in at % for a 600 A thick magnetic layer is Co-12%Cr-6%Ta for a 1000 A thick Cr underlayer, the maximum coercivity is 1200 Oe.

As indicated above, the thickness of the Cr underlayer of CoNiCr/Cr for use in longitudinal recording should be about 2500 A or above so that the coercivity of the medium can be approaching saturation. For a CoCrTa/Cr medium, in order for the coercivity to reach 1200 Oe, the required thickness of the Cr

SUMMARY OF THE INVENTION

It is therefore the object of the present invention to provide a CoCrTa/Cr magnetic medium for longitudinal recording with thin Cr underlayer and high coercivity.

It is another object of the present invention to provide a preparation method for high density magnetic recording medium.

Still another object of the present invention is to provide a preparation method for high density magnetic recording medium, wherein improved coercivity of the medium can be obtained with greatly reduced cost.

Other objects of this invention will become apparent as the description proceeds in connection with the accompanying drawings.

DETAILED DESCRIPTION OF THE INVENTION

Figure 1:
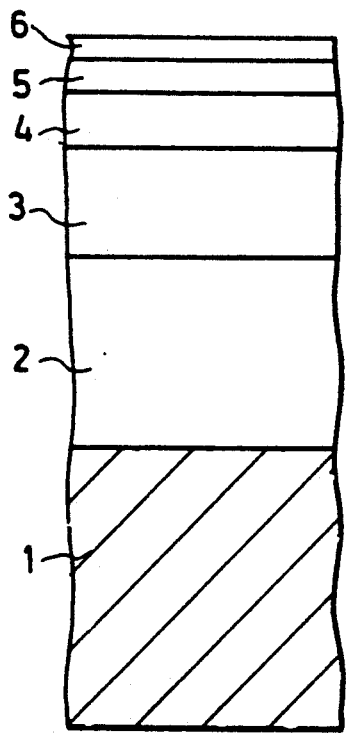
FIG. 1 is a structural drawing of a conventional sputtered hard disk.

The present invention relates to a double layer (magnetic layer CoCrTa and underlayer Cr) film magnetic recording medium and the preparation method thereof. The magnetic recording medium comprises a nonmagnetic substrate, a thin Cr underlayer RF sputtered on the substrate, and a CoCrTa magnetic layer RF sputtered on the Cr underlayer. In accordance with the present invention, the substrate used for the medium can be glass or Ni-P treated Al-Mg alloy. The 8 inch diameter Co target adhesived with appropriate pieces of Cr and Ta chips to comprise the ternary magnetic alloy target. The non-magnetic target is 99.9% pure Cr. The distance between the target and the substrate can be desirably adjusted.

In accordance with the present invention, the steps of preparation of the medium are as follow:

1. evacuate a sputtering compartment to a background pressure of $3 \times 10^{-7}$ mtorr;

2. passing low pressure argon gas to sputter etching substrates (The substrate can be selected from glass or Ni-P treated Al-Mg alloy);

3. sputtering the Cr underlayer under the following conditions;

Argon pressure: 5 mtorr–20 mtorr, preferably 10 mtorr; substrate bias: $-100$ V; sputtering thickness: 200–3000 Å;

4. sputtering the CoCrTa magnetic film under the following conditions:

Argon pressure 2 mtorr to 20 mtorr, preferably 3 to 5 mtorr; substrate bias: $-25$ V to $-150$ V, preferably $-100$ V to $-125$ V; sputtering thickness: 200 Å to 2000 Å; compositions of the magnetic film: $Co_{100-x-y}Cr_xTa_y/Cr$, wherein, $12<x<16$, $1.5<y<5$; and 5. measurement of magnetic properties: The magnetic properties are measured with a Vibrating Sample Magnetometer (VSM).

In accordance with the present invention, under the sputtering conditions of argon pressure being 10 mtorr and a substrate bias of $-100$ V, a sputtered bcc (110) preferred orientation of Cr underlayer is formed. In other words, grain growth away from this texture is a minimum, which is favorable to epitaxially growth.

The invention will be further illustrated by the examples that follow. In the following examples, the sputtering of the Cr underlayer is set at the above conditions. That is, the argon pressure is 10 mtorr and the bias of the substrate is $-100$ V. In these examples, only the thicknesses of the Cr underlayers and the sputtering conditions of the CoCrTa layers are changed.

EXAMPLES

Example 1

Figure 2:
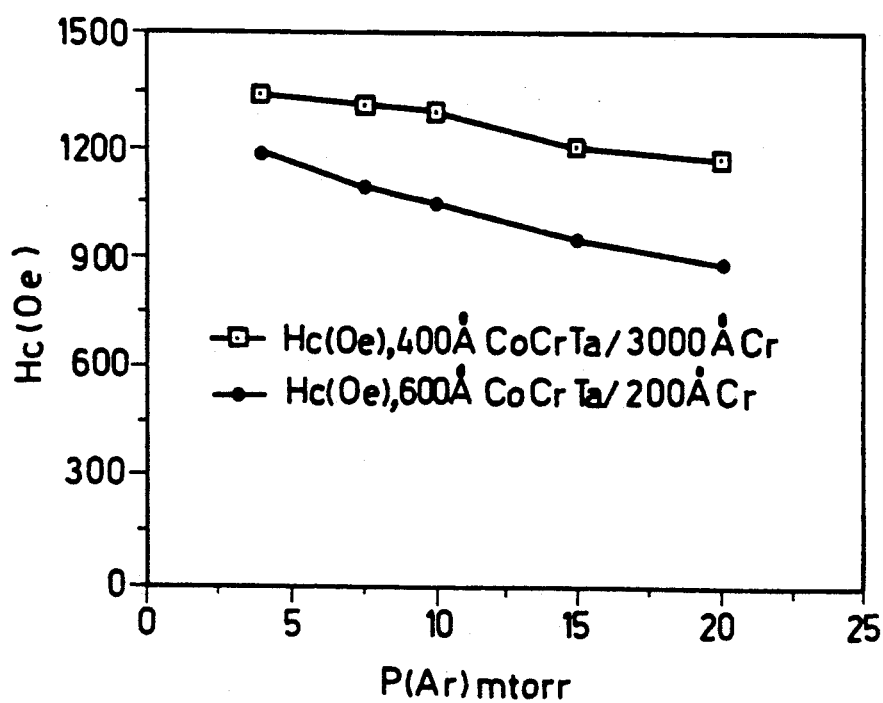
FIG. 2 is a graph illustrating the coercivity as a function of Argon pressure in sputtering CoCrTa in accordance with the present invention.

In accordance with the steps mentioned above to obtain CoCrTa/Cr medium, the thickness of the Cr underlayer was set at 3000 Å, the thickness of CoCrTa was 400 Å, and the substrate bias was $-100$ V. Various sputtering argon pressures of CoCrTa from 4 mtorr to 20 mtorr were introduced. Magnetic measurements were made using a Vibrating Sample Magnetometer (VSM). The coercivity decreased from 1350 Oe to 1200 Oe, as shown in FIG. 2, which illustrates the coercivity as a function of argon pressure in sputtering CoCrTa.

Example 2

In accordance with the steps mentioned above to obtain CoCrTa/Cr medium, the thickness of the Cr underlayer was set at 200 Å, the thickness of CoCrTa was 600 Å, and the substrate bias was $-100$ V. Various sputtering argon pressures of CoCrTa from 4 mtorr to 20 mtorr were introduced. Magnetic measurements were made using Vibrating Sample Magnetometer (VSM). The coercivity decreased from 1200 Oe to 900 Oe as shown in FIG. 2, which illustrates the coercivity as a function of argon pressure in sputtering CoCrTa.

Example 3

Figure 3:
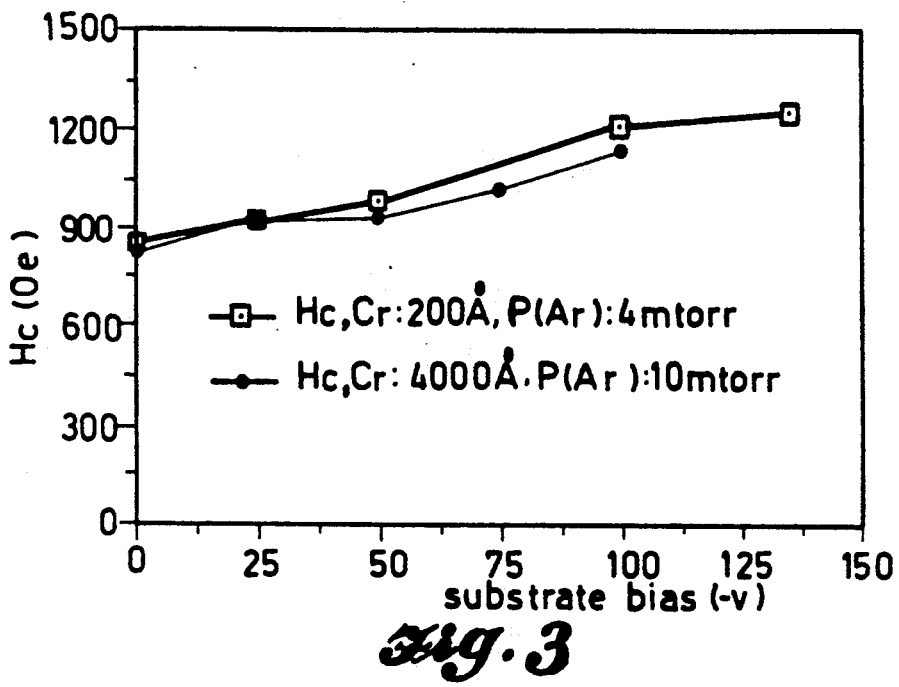
FIG. 3 is a graph illustrating the coercivity as a function of substrate bias in sputtering CoCrTa in accordance with the present invention.

In accordance with the steps mentioned above to obtain CoCrTa/Cr medium, the thickness of the Cr underlayer was set at 4000 Å, the thickness of CoCrTa was 600 Å. The sputtering argon pressure of CoCrTa was fixed at $-10$ mtorr. The substrate bias was varied from 0 to $-100$ V. Magnetic measurements were made using a Vibrating Sample Magnetometer (VSM). The coercivity increased from 850 Oe to 1050 Oe as shown in FIG. 3, which illustrates the coercivity as a function of substrate bias in sputtering CoCrTa.

Example 4

In accordance with the steps mentioned above to obtain CoCrTa/Cr medium, the thickness of the Cr underlayer was set at 200 Å, the thickness of CoCrTa was 600 Å. The sputtering argon pressure of CoCrTa was fixed at 4 mtorr. Various substrate biases from 0 to coercivity $-135$ V were introduced. Magnetic measurements were made using a Vibrating Sample Magnetometer (VSM). The coercivity increased from 850 Oe to 1240 Oe as shown in FIG. 3, which illustrates the coercivity as a function of substrate bias in sputtering CoCrTa.

Example 5

Figure 4:
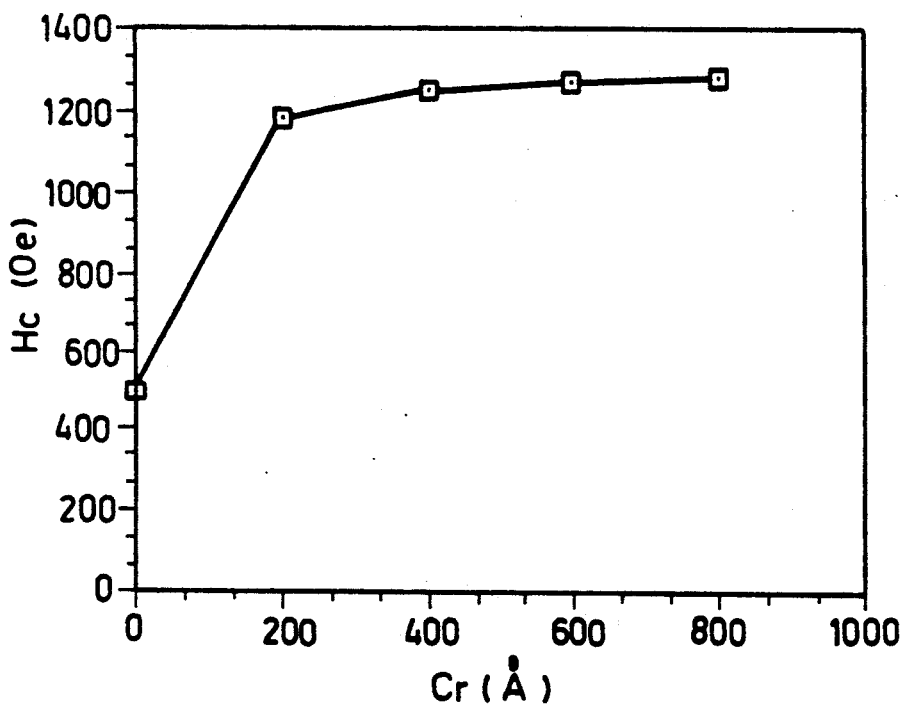
FIG. 4 is a graph illustrating the Cr thickness effect on coercivity of RF sputtered CoCrTa/Cr thin film in accordance with the present invention.

In accordance with the steps mentioned above to obtain CoCrTa/Cr medium, the thickness of CoCrTa was 600 Å, and the substrate bias was $-100$ V. The sputtering argon pressure of CoCrTa was fixed at 4 mtorr. Various thicknesses of the Cr underlayer from 200 Å to 800 Å were introduced. Magnetic measurements were made using a Vibrating Sample Magnetometer (VSM). The coercivity increased from 1190 Oe to 1280 Oe as shown in FIG. 4, which shows the effect of the Cr thickness on the coercivity of the RF sputtered CoCrTa/Cr thin film. Experimental result also shows when the thickness of Cr underlayer is 3000 A, the coercivity merely increased to 1300 Oe.

Example 6

Figure 5:
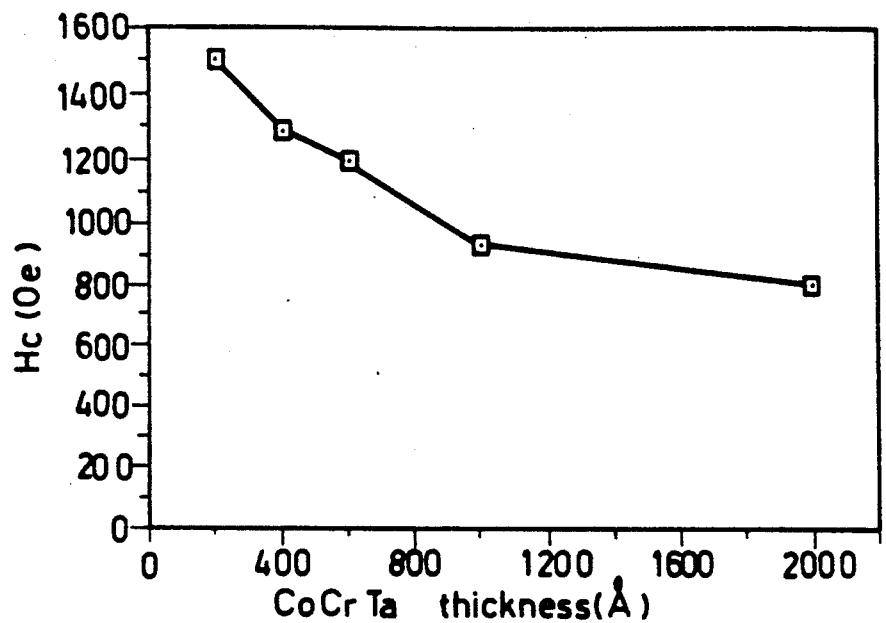
FIG. 5 is a graph illustrating the relationship between the coercivity and the thickness of CoCrTa film in accordance with the present invention.

In accordance with the steps mentioned above to obtain CoCrTa/Cr medium, all the sputtering parameters for the Cr underlayer and CoCrTa magnetic layer were fixed except the thickness of CoCrTa was varied from 2000 A to 200 A. Magnetic measurements were made using a Vibrating Sample Magnetometer). The coercivity increased from 800 Oe to 1500 Oe. It is shown that the value of the coercivity increases as the magnetic thickness decreases as shown in FIG. 5.

FIG. 2 indicates the coercivity as a function of argon pressure in CoCrTa sputtering. As shown in the figure, the coercivity decreases from 1200 Oe at argon pressure P(Ar) equal to 4 mtorr, to 865 Oe at P(Ar)=20 mtorr. The other one with a thinner magnetic film and thicker Cr underlayer shows the Hc decending from 1350 Oe to 1150 Oe in the same range. Both the magnetic medium with 200 A and 3000 A Cr underlayer respectively have the same trend of decreasing coercivity with increasing Argon pressure FIG. 3 shows the variation in the coercivity as a function of negative bias applied to the substrate during the sputtering of the magnetic films. The coercivity rose from 850 Oe at without bias to 1200 Oe at −100 V substrate bias. The application of negative bias to the substrate corresponds to the bombardment of Argon ions on the growing film. This creates strong stress on the film during the deposition. Therefore, it has the same effect as decreasing the Argon pressure as mentioned above with respect to increasing the stress-induced coercivity in the film plane. The effect of chromium thickness on the coercivity of CoCrTa is illustrated in FIG. 4. It shows that the in-plane coercivity at first rises rapidly from 475 Oe at the film without a Cr underlayer to 1190 Oe at 200 A Cr, and 1250 Oe at 400 A Cr, then levels off to 1275 Oe at 800 A Cr. The phenomena of quickly saturated coercivity for CoCrTa deposited on such thin Cr underlayer is very different from the usual CoNiCr/Cr media which needs larger than 2500 A Cr underlayer. FIG. 5 illustrates the coercivity as a function of magnetic film thickness for CoCrTa with a fixed Cr underlayer (200 A). The coercivity decreases monotonically with thickness and behaves in a similar manner from 200 A to 2000 A. A coercivity of 1500 Oe can be obtained at 200 A thickness of CoCrTa film. All these samples diffracted by X-ray show the well (10T0) texture and without (10T1) diffraction. One reason for the reduction of coercivity with film thickness increase probably can be explained by the demagnetizing field which occurs in the film plane, namely, the axis of in-plane grain diameter being less than the long axis of film direction as the thickness increases. This figure indicates that the thinner the CoCrTa layer, the higher the coercivity. However, if the thickness is too small, then the recording medium signal output will be insufficient. The thicker the CoCrTa, the lower the coercivity. Thus, in accordance with the present invention, the thickness of the CoCrTa magnetic layer is chosen at a thickness of 600 A to 1000 A.

Figure 6:
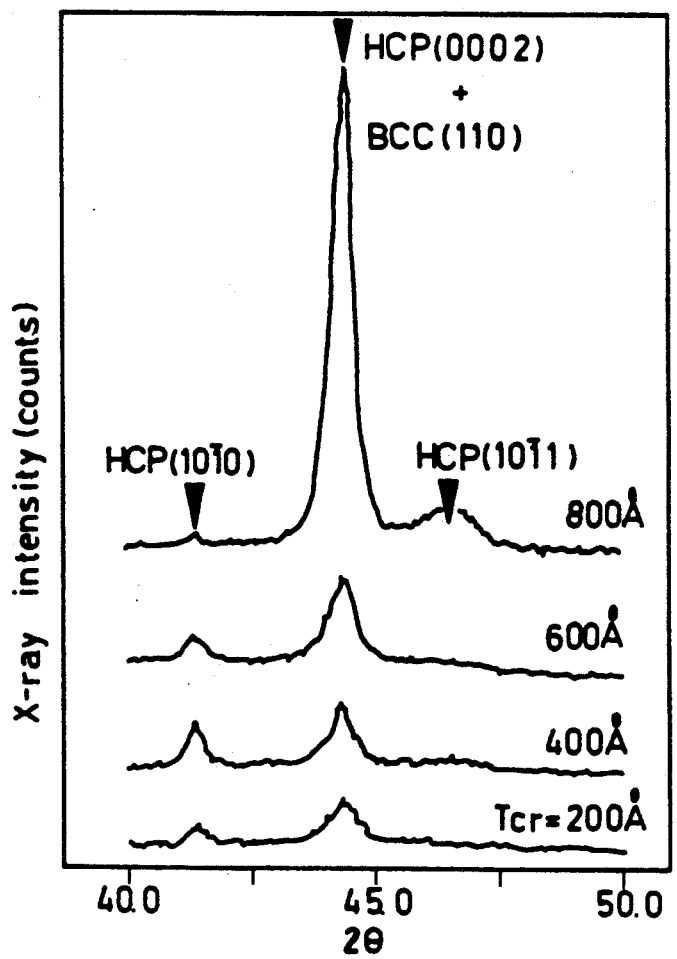
FIG. 6 is X-ray diffraction patterns of CoCrTa on various thickness of Cr underlayers in accordance with the present invention.

X-ray diffraction analysis is made on the CoCrTa/Cr medium which is grown on the thin Cr underlayer (<600 A). Significant HCP(10T0) diffraction is observed. To investigate the mechanism of the coercivity enhancement in the thin underlayer, Cr thickness effects on the texture growth of CoCrTa were examined by X-ray diffraction patterns as shown in FIG. 6. The relative intensity of HCP I(10T0)/I(10T1) increases as the Cr thickness decreases. This implies that the thinner the Cr underlayer, the stronger the (10T0) texture occurs for CoCrTa grains. Then, the easy axis (c-axis) of this alloy will lie in the plane of the film. As a result, the dominating factor for the in-plane coercivity increasing by crystal anisotropy is due to (10T0) instead of (10T1) in Cr thickness less than 600 A. As shown in FIG. 6, when the thickness of the Cr underlayer is greater than 800 A, the diffraction intensity of HCP(10T0) decreases and that of HCP(10T1) increases. The magnetic crystal anisotropy in the horizontal direction illustrates why even though the Cr underlayer is only 200 A in thickness, the coercivity of the medium can be very high. When the thickness of the Cr underlayer gradually increases, HCP(10T0) decreases but HCP(10T1) increases. Meanwhile, from the microstructure observation grain growth and substructure formation in the sputtered film can explain the gradual increase of the coercivity. From the above, if the Cr underlayer is thin, the main factor which influences Hc is the crystal growth of HCP(10T0). If the Cr underlayer is thick, the grain size growth and the microstructure change thereof are the accompanying factors.

In accordance with the present invention, RF sputtered CoCrTa films deposited on a relatively thin Cr underlayer (<200 A) exhibit a (10T0) texture which provides the high coercivity of the magnetic films.

The invention has been described in detail including the preferred embodiments thereof. However, it will be appreciated that those skilled in the art, upon consideration of this disclosure, may make modifications and improvements within the scope of this invention.

I claim:

1. An RF sputtering method for preparing a CoCrTa/Cr magnetic media comprising the steps of:
   (a) evacuating a sputtering compartment containing a substrate material to a background pressure of 3×10−7 mtorr;
   (b) passing low pressure argon gas to sputter-etch said substrate material;
   (c) sputtering a Cr underlayer on said substrate under the conditions of argon pressure: 5 mtorr to 20 mtorr; substrate bias: −100 V; sputtering thickness: 200-800 A; and
   (d) sputtering a CoCrTa magnetic film on said Cr underlayer under the conditions of argon pressure: 2 mtorr to 20 mtorr; substrate bias: −25 V to −150 V; sputtering thickness: 200 A to 2000 A.

2. An RF sputtering method as set forth in claim 1, wherein the substrate material is glass or Ni-P treated Al-Mg alloy.

3. An RF sputtering method as set forth in claim 1, wherein the sputtering of Cr underlayer is carried out at an argon pressure of 10 mtorr and a substrate bias of −100 V.

4. An RF sputtering method as set forth in claim 1, wherein the sputtering of CoCrTa film is carried out at an argon pressure of 3 mtorr to 5 mtorr and a substrate bias of −100 V to −125 V.

5. An RF sputtering method as set forth in claim 1, wherein the CoCrTa film thickness is from 600 A to 1000 A.

6. The method of claim 1 where the Cr underlayer sputtering step is conducted at an argon pressure of about 10 mtorr.

7. The method of claim 6 where said CoCrTa sputtering step is conducted in an argon pressure of from 3 to 5 mtorr and a substrate bias of from −100 V to −125 V.

8. The method of claim 1 where said CoCrTa sputtering step is conducted in an argon pressure of from 3 to 5 mtorr and a substrate bias of from −100 V to −125 V.

* * * * *